United States Patent
Kimura et al.

(10) Patent No.: US 10,361,335 B2
(45) Date of Patent: Jul. 23, 2019

(54) LIGHT RECEIVING ELEMENT AND METHOD OF MANUFACTURING THE SAME

(71) Applicant: SUMITOMO ELECTRIC INDUSTRIES, LTD., Osaka (JP)

(72) Inventors: Daisuke Kimura, Yokohama (JP); Sundararajan Balasekaran, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/968,266

(22) Filed: May 1, 2018

(65) Prior Publication Data

US 2018/0351029 A1    Dec. 6, 2018

(30) Foreign Application Priority Data

Jun. 1, 2017   (JP) ................................ 2017-109470

(51) Int. Cl.
*H01L 27/146*   (2006.01)
*H01L 31/18*    (2006.01)
(Continued)

(52) U.S. Cl.
CPC ...... *H01L 31/1828* (2013.01); *H01L 31/0304* (2013.01); *H01L 31/03529* (2013.01); *H01L 31/035236* (2013.01); *H01L 31/109* (2013.01)

(58) Field of Classification Search
CPC .......... H01L 27/1463; H01L 27/14645; H01L 27/1461; H01L 27/14621; H01L 27/14614;

(Continued)

(56) References Cited

U.S. PATENT DOCUMENTS 5,479,032 A * 12/1995 Forrest ................ H01L 27/1465
257/184
5,581,084 A * 12/1996 Chapman .......... H01L 27/14649
250/332

(Continued)

FOREIGN PATENT DOCUMENTS

| JP | 11-322009 | 11/1999 |
|----|-----------|---------|
| JP | 2001-144278 | 5/2001 |
| JP | 2016-66682 | 4/2016 |

*Primary Examiner* — Cuong B Nguyen
*Assistant Examiner* — Samuel Park
(74) *Attorney, Agent, or Firm* — Smith, Gambrell & Russell, LLP.

(57) ABSTRACT

A method includes: forming a first mask having a first opening and a second opening; performing etching by using the first mask, to allow the etching to progress at a higher rate in the second opening than in the first opening; forming a second mask having a third opening and a fourth opening; performing etching by using the second mask, to form a mesa in a region interposed by the third opening, and an n-type contact region in the fourth opening; and forming a first electrode on the mesa and a second electrode on the n-type contact region, the first electrode being electrically connected to the third layer, the second electrode being electrically connected to the first layer, wherein a region covered with the first mask and exposed through the fourth opening of the second mask turns into the n-type contact region after the etching using the second mask.

9 Claims, 7 Drawing Sheets

(51) Int. Cl.
*H01L 31/0352* (2006.01)
*H01L 31/109* (2006.01)
*H01L 31/0304* (2006.01)

(58) Field of Classification Search
CPC ........... H01L 27/14627; H01L 21/8238; H01L 27/0922; H01L 27/11812; H01L 2027/11814; H01L 2027/11816; H01L 2027/11818; H01L 2027/1182; H01L 27/1464; H01L 27/14643; H01L 27/14623; H01L 27/14687; H01L 27/14609; H01L 25/167; H01L 27/3227; H01L 31/02024; H01L 31/0203; H01L 31/0284; H01L 31/1032; H01L 31/107; H01L 25/043; H01L 27/14625; H01L 27/14636; H01L 21/00; H01L 21/70; H01L 21/746; H01L 21/7624; H01L 21/76297; H01L 21/77; H01L 21/82; H01L 21/8221; H01L 23/50; H01L 27/01; H01L 27/0203; H01L 27/0605; H01L 27/0611; H01L 27/0688; H04N 5/374; H04N 5/378
See application file for complete search history.

(56) References Cited

U.S. PATENT DOCUMENTS

| | | | | |
|---|---|---|---|---|
| 5,959,339 | A * | 9/1999 | Chapman | H01L 27/14649 250/370.01 |
| 6,147,349 | A * | 11/2000 | Ray | H01L 31/103 250/338.4 |
| 2006/0118722 | A1* | 6/2006 | Pham | H01L 27/1465 250/338.4 |
| 2011/0037133 | A1* | 2/2011 | Su | H01L 31/03528 257/432 |
| 2013/0043372 | A1* | 2/2013 | Wehner | H01L 27/14647 250/208.1 |
| 2015/0028216 | A1* | 1/2015 | Camargo | H01L 27/1446 250/349 |

* cited by examiner

US 10,361,335 B2

LIGHT RECEIVING ELEMENT AND METHOD OF MANUFACTURING THE SAME

CROSS-REFERENCE TO RELATED APPLICATION

This application is based upon and claims the benefit of priority of the prior Japanese Patent Application No. 2017-109470, filed on Jun. 1, 2017, the entire contents of which are incorporated herein by reference.

BACKGROUND

(i) Technical Field

The present invention relates to a light receiving element and a method of manufacturing the light receiving element.

(ii) Related Art

Known light receiving elements each have a mesa structure, and receive light to generate electric signals (see Japanese Patent Application Laid-Open No. 2001-144278, for example).

SUMMARY

In a case where a light receiving element is an infrared ray sensor, for example, it is preferable to narrow the pitch between the mesas to achieve high-density pixels. Also, to reduce dark current, it is preferable to dispose electrodes near the light absorbing layer. Where the pitch between the mesas is narrow, however, it is difficult to form the electrodes.

In view of the above, the present invention aims to provide a light receiving element and a method of manufacturing the light receiving element capable of narrowing the pitch between the mesas and forming the electrodes.

According to an aspect of the present invention, there is provided a method of manufacturing a light receiving element, the method including: the step of growing a semiconductor layer on a semiconductor substrate formed with a compound semiconductor, the semiconductor layer including a first layer of a first conductivity type, a light absorbing layer, a second layer of a second conductivity type, and a third layer of the second conductivity type that are sequentially stacked; the step of forming a first mask on the semiconductor layer, the first mask having a first opening and a second opening, the second opening being at a distance from the first opening and having a greater width than the first opening; the step of performing etching on the semiconductor layer by using the first mask, to allow the etching to progress at a higher rate in the second opening than in a portion in the first opening in the semiconductor layer; the step of forming a second mask on the semiconductor layer, the second mask having a third opening and a fourth opening, the third opening overlapping the first opening, the fourth opening overlapping the second opening and having a greater width than the second opening; the step of performing etching on the semiconductor layer by using the second mask, to form a mesa in a region interposed by the third opening in the semiconductor layer, and an n-type contact region formed with the first layer in the fourth opening; and the step of forming a first electrode on the mesa and a second electrode on the n-type contact region, the first electrode being electrically connected to the third layer, the second electrode being electrically connected to the first layer, wherein the mesa includes the first layer, the light absorbing layer, the second layer, and the third layer, and of the semiconductor layer, a region covered with the first mask and exposed through the fourth opening of the second mask turns into the n-type contact region after the etching using the second mask.

According to another aspect of the present invention, there is provided a light receiving element including: a semiconductor substrate formed with a compound semiconductor; a semiconductor layer including a first layer of a first conductivity type, a light absorbing layer, a second layer of a second conductivity type, and a third layer of the second conductivity type that are sequentially stacked on the semiconductor substrate, the semiconductor layer having a mesa, a terrace, an n-type contact region, and a groove formed in a region extending from a central portion toward an outer side of the semiconductor substrate; a first electrode that is provided on the mesa and is electrically connected to the third layer; a second electrode that is provided on a portion extending from a top of the terrace to an inner side of the groove, and is in contact with and electrically connected to the first layer in the n-type contact region, wherein the mesa and the terrace include the first layer, the light absorbing layer, the second layer, and the third layer, and the n-type contact region is formed with the first layer.

DETAILED DESCRIPTION

Figure 1A:
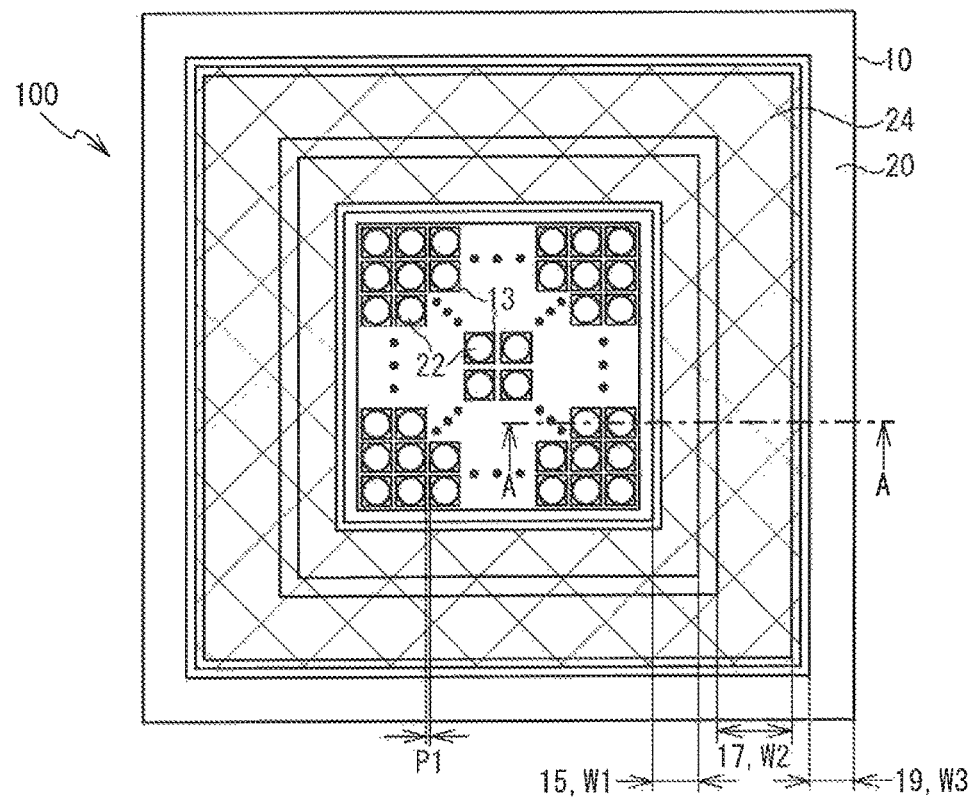
FIG. 1A is a plan view of an example of a light receiving element according to a first embodiment.

Description of Embodiments of the Present Invention

First, the contents of embodiments of the present invention are listed below.

One mode of the present invention is (1) a light receiving element manufacturing method that includes: the step of growing a semiconductor layer on a semiconductor substrate formed with a compound semiconductor, the semiconductor layer including a first layer of a first conductivity type, a light absorbing layer, a second layer of a second conductivity type, and a third layer of the second conductivity type that are sequentially stacked; the step of forming a first mask on the semiconductor layer, the first mask having a first opening and a second opening, the second opening being at a distance from the first opening and having a greater width than the first opening; the step of performing etching on the semiconductor layer by using the first mask, to cause the etching to progress at a higher rate in the second opening than in a portion in the first opening in the semiconductor layer; the step of forming a second mask on the semiconductor layer, the second mask having a third opening and a fourth opening, the third opening overlapping the first opening, the fourth opening overlapping the second opening and having a greater width than the second opening; the step of performing etching on the semiconductor layer by using the second mask, to form a mesa in a region interposed by the third opening in the semiconductor layer, and an n-type contact region formed with the first layer in the fourth opening; and the step of forming a first electrode on the mesa and a second electrode on the n-type contact region, the first electrode being electrically connected to the third layer, the second electrode being electrically connected to the first layer. In this light receiving element, the mesa includes the first layer, the light absorbing layer, the second layer, and the third layer, and, of the semiconductor layer, a region covered with the first mask and exposed through the fourth opening of the second mask turns into the n-type contact region after the etching using the second mask. By this method, the second electrode and the first layer can be electrically connected to each other via the n-type contact region. Furthermore, there is no need to provide the second electrode between mesas, and thus, the pitch between the mesas can be made smaller.

(2) In the step of forming the second mask, a portion adjacent to the second opening may be removed from the first mask so that the second mask is formed from the first mask. With this step, the manufacturing process can be simplified.

(3) The step of forming the first mask may include the step of forming the first opening and the second opening in the first mask by performing etching using a first photoresist, and the step of forming the second mask may include the step of forming the fourth opening by performing etching using a second photoresist and removing a portion adjacent to the second opening from the first mask. With this step, the manufacturing process can be simplified. Further, the areas of the first resist mask and the second resist mask become smaller, and generation of an altered layer is prevented. Thus, etching is not easily hindered by an altered layer, and the first resist mask and the second resist mask are effectively removed.

(4) In the step of performing etching using the second mask, etching may be performed on a region overlapping the first opening and the third opening in the semiconductor layer until reaching the first layer, a terrace including the first layer, the light absorbing layer, the second layer, and the third layer may be formed in a region interposed between the third opening and the fourth opening in the semiconductor layer, and a groove extending to the semiconductor substrate may be formed in a position overlapping the second opening and the fourth opening. Through the two-time etching, mesas and an n-type contact region can be formed, and the manufacturing process is simplified.

(5) The n-type contact region may be located between the terrace and the groove. The distance between the second electrode and the light absorbing layer can be shortened, and the dark current to be generated due to lattice defects, impurities, and the like in the first layer can be reduced.

(6) The first mask may have the first openings in a lattice-like pattern, the second mask may have the third openings in a lattice-like pattern, the third openings overlapping the first openings. In the step of performing etching on the semiconductor layer by using the second mask, mesas may be formed in a region surrounded by the third opening in the semiconductor layer.

(7) The width of the second opening may be ten or more times greater than the width of the first opening, and the width of the fourth opening may be ten or more times greater than the width of the third opening. With this arrangement, etching accompanied by a micro-loading effect is performed.

(8) The first layer may be an n-type superlattice layer, and the second layer may be a p-type superlattice layer. The second electrode connected to the first layer has the n-type conductivity type, and the first electrode connected to the third layer has the p-type conductivity type.

(9) The light receiving element manufacturing method may further include: the step of forming an insulating film covering the respective upper surfaces and the respective side surfaces of the mesa and the terrace; and the step of forming a fifth opening and a sixth opening in the insulating film, the fifth opening being located on the mesa, the sixth opening being located above the n-type contact region and the groove. The first electrode may be in contact with the third layer exposed through the fifth opening, and the second electrode may be in contact with the first layer exposed through the sixth opening. The light absorbing layer, the second layer and the third layer are insulated from the second electrode by the insulating film. Further, the compound semiconductor layer can be protected by the insulating film.

(10) A light receiving element includes: a semiconductor substrate formed with a compound semiconductor; a semiconductor layer including a first layer of a first conductivity type, a light absorbing layer, a second layer of a second conductivity type, and a third layer of the second conductivity type that are sequentially stacked on the semiconductor substrate, the semiconductor layer having a mesa, a terrace, an n-type contact region, and a groove formed in a region extending from a central portion toward an outer side of the semiconductor substrate; a first electrode that is provided on the mesa and is electrically connected to the third layer; a second electrode that is provided on a portion extending from the top of the terrace to the inside of the groove, and is in contact with and electrically connected to the first layer in the n-type contact region. In this light receiving element, the mesa and the terrace include the first layer, the light absorbing layer, the second layer, and the third layer, and the n-type contact region is formed with the first layer. In this structure, the second electrode and the first layer can be electrically connected to each other in the n-type contact region. Further, there is no need to provide the second electrode between mesas, and thus, the pitch between the mesas can be shortened.

DETAILED DESCRIPTION OF EMBODIMENTS OF THE PRESENT INVENTION

The following is a description of specific examples of a light receiving element and a method of manufacturing the light receiving element according to an embodiment of the present invention, with reference to the accompanying drawings. It should be noted that the present invention is not limited to these examples, but all modifications thereof are shown in the claims and are included in the spirit and the scope equivalent to the claims.

First Embodiment

Figure 1B:
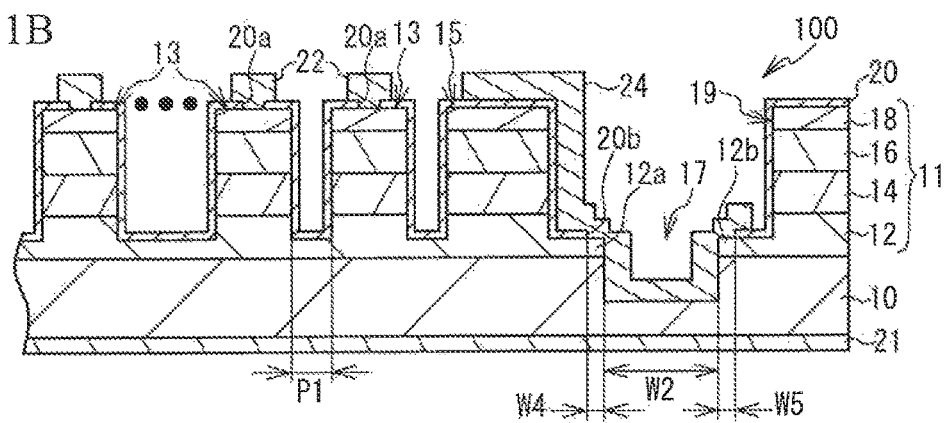
FIG. 1B is a cross-sectional view taken along the line A-A defined in FIG. 1A.

FIG. 1A is a plan view of an example of a light receiving element 100 according to a first embodiment. FIG. 1B is a cross-sectional view of the light receiving element 100, taken along the line A-A defined in FIG. 1A. The black dots in the drawings indicate that mesas 13 and the like are provided therein.

(Light Receiving Element 100)

As shown in FIG. 1A, the light receiving element 100 is a rectangular chip, and each side is not shorter than 5 mm and not longer than 20 mm, for example. As shown in FIG. 1B, the light receiving element 100 includes a semiconductor substrate 10 and a semiconductor layer 11. The semiconductor substrate is formed with n-type gallium antimonide (GaSb) that is not thinner than 300 μm and not thicker than 700 μm. The semiconductor layer 11 is formed by stacking an n-type semiconductor layer 12 (the first layer), a light absorbing layer 14, a p-type semiconductor layer 16 (the second layer), and a p-type contact layer 18 (the third layer) in order of proximity to the semiconductor substrate 10. A buffer layer formed with GaSb, for example, may be provided between the n-type semiconductor layer 12 and the semiconductor substrate 10. An antireflection film 21 is provided on the lower surface (the surface on the opposite side from the semiconductor layer 11) of the semiconductor substrate 10.

The n-type semiconductor layer 12 has an n-type GaSb/InAs superlattice structure that is formed by stacking a GaSb layer and an indium arsenide layer, for example, and is doped with silicon (Si). The n-type semiconductor layer 12 is 1 to 5 μm in thickness, for example, and has a doping concentration of $2 \times 10^{-18}$ cm$^{-3}$, for example. The light absorbing layer 14 has an undoped GaSb/InAs superlattice structure, for example, and is 1 to 4 μm in thickness, for example. The p-type semiconductor layer 16 has a p-type GaSb/InAs superlattice structure doped with beryllium (Be), for example. The p-type semiconductor layer 16 is 0.2 to 0.8 μm in thickness, for example, and has a doping concentration of $2 \times 10^{18}$ cm$^{-3}$. A superlattice structure has a type-II band structure. The p-type contact layer 18 is formed with p-type GaSb, for example, and is 0.05 to 0.4 μm in thickness, for example.

The n-type semiconductor layer 12, the p-type semiconductor layer 16, and the p-type contact layer 18 each have a high transmittance (90% or higher, for example), and transmit infrared light. The light absorbing layer 14 receives infrared light of 3 to 15 μm in wavelength, for example. Specifically, when infrared light enters from the side of the semiconductor substrate 10, for example, the infrared light is photoelectrically converted in the light absorbing layer 14 of the light receiving element 100, and the light absorbing layer 14 generates photocarriers (electrons and holes). That is, the light receiving element 100 functions as a photodiode. Current generated from the photocarriers is applied to a readout integrated circuit or the like connected to the light receiving element 100, so that image information or the like is generated in accordance with the current.

Mesas 13, terraces 15 and 19, and a groove 17 are formed in the light receiving element 100 from the center toward the outer side of the semiconductor substrate 10. The mesas 13 are arranged in a two-dimensional array in the center of the light receiving element 100. The mesas 13 and the terraces 15 and 19 include the n-type semiconductor layer 12, the light absorbing layer 14, the p-type semiconductor layer 16, and the p-type contact layer 18. Each mesa 13 functions as a photodiode. The groove 17 extends to the n-type semiconductor layer 12. The height of the mesas 13 is equal to the height of the terrace 15. The mesas 13 are separated from one another by grooves that extend to the n-type semiconductor layer 12, and are electrically connected to one another by the n-type semiconductor layer 12. The terrace 15 is provided to surround the region in which the mesas 13 are formed. The groove 17 that surrounds the terrace 15 is provided on the outer side of the terrace 15, and the groove 17 is further surrounded by the terrace 19 that is located on the outer side of the groove 17.

An n-type contact region 12a is provided between the terrace 15 and the groove 17, and an n-type contact region 12b is provided between the groove 17 and the terrace 19. As shown in FIG. 1A, the n-type contact region 12a surrounds the terrace 15, and the n-type contact region 12b surrounds the groove 17. As shown in FIG. 1B, the n-type contact regions 12a and 12b are platform-like regions, are formed with the n-type semiconductor layer 12, and are in contact with an electrode 24. The groove 17 is interposed between the n-type contact regions 12a and 12b.

The pitch P1 between the mesas 13 (the distance between each two adjacent mesas 13) shown in FIGS. 1A and 1B is 0.5 to 3 μm, for example. The width W1 of the terrace 15 is 50 to 100 μm, for example, the width W2 of the groove 17 is 20 to 290 μm, for example, and the width W3 of the terrace 19 is 55 to 300 μm, for example. The width W1 of the terrace 15 is greater than the width of each mesa 13, and, for example, is at least twice as great as the width of each mesa 13. The width W4 of the n-type contact region 12a shown in FIG. 1B is 3 to 30 μm, for example, and the width W5 of the n-type contact region 12b is 0 to 30 μm, for example. In other words, the n-type contact region 12b is not necessarily used.

As shown in FIG. 1B, the surfaces (the upper surfaces and the side surfaces) of the mesas 13 and the terraces 15 and 19 are coated with an insulating film 20. The insulating film 20 is formed with an insulator such as silicon oxide (SiO$_2$) or silicon nitride (SiN) of 100 to 400 nm in thickness, for example. The insulating film 20 has an opening 20a (the fifth opening) above each mesa 13, and an opening 20b (the sixth opening) between the terraces 15 and 19. The p-type contact layer 18 is exposed through the openings 20a, and the n-type semiconductor layer 12 and the semiconductor substrate 10 are exposed through the opening 20b. The n-type contact regions 12a and 12b, and the groove 17 are located inside the opening 20b.

Electrodes 22 are provided on the mesas 13, and are in contact with the p-type contact layer 18 exposed through the openings 20a. An electrode 24 is provided on a portion extending from the top of the terrace 15 to the top of the terrace 19 via the inside of the groove 17, is in contact with the n-type semiconductor layer 12 in the n-type contact regions 12a and 12b, and is in contact with the semiconductor substrate 10 inside the groove 17. The p-type semiconductor layer 16, the p-type contact layer 18, and the electrodes 22 are electrically connected to one another. The p-type semiconductor layer 16 and the p-type contact layer 18 are p-type semiconductor layers, and the electrodes 22 function as p-type electrodes. The n-type semiconductor layer 12 and the electrode 24 are electrically connected in the n-type contact regions 12a and 12b. The n-type semiconductor layer 12 has a different conductivity type from that of the p-type semiconductor layer 16 and the like, and is an n-type semiconductor layer. The electrode 24 functions as an n-type electrode, and has a reference potential (a ground potential, for example). The electrodes 22 and 24 are formed with titanium (Ti), platinum (Pt), and gold (Au), which are stacked in this order from the bottom, for example. Bumps formed with indium (In) or the like may be provided on the electrodes 22 and 24. The bumps are used to electrically connect the light receiving element 100 and a readout integrated circuit or the like.

(Method of Manufacturing the Light Receiving Element 100)

FIGS. 2A and 2B, FIGS. 4A through 4C, and FIGS. 6A through 6C are cross-sectional views illustrating an example of a method of manufacturing the light receiving element 100. FIG. 3A is a plan view illustrating the example of the method of manufacturing the light receiving element 100. FIG. 3B is a cross-sectional view taken along the line A-A defined in FIG. 3A. FIG. 5A is a plan view illustrating the example of the method of manufacturing the light receiving element 100. FIG. 5B is a cross-sectional view taken along the line A-A defined in FIG. 5A.

Figure 2A:
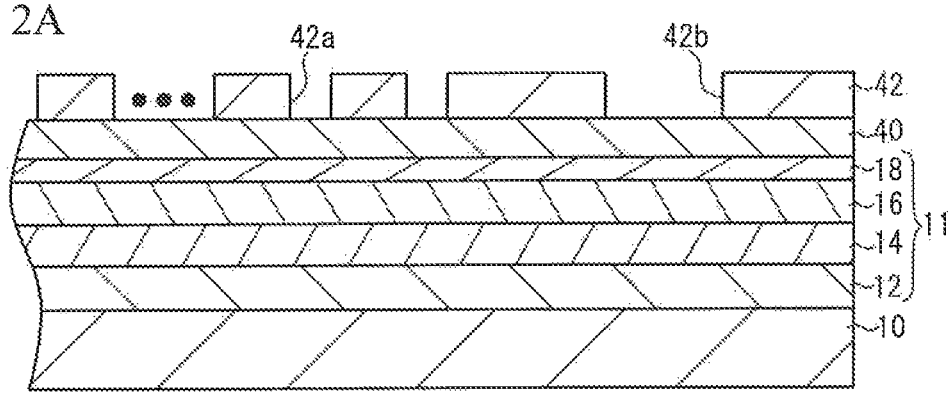
FIGS. 2A and 2B are cross-sectional views illustrating an example method of manufacturing the light receiving element.
Figure 3A:
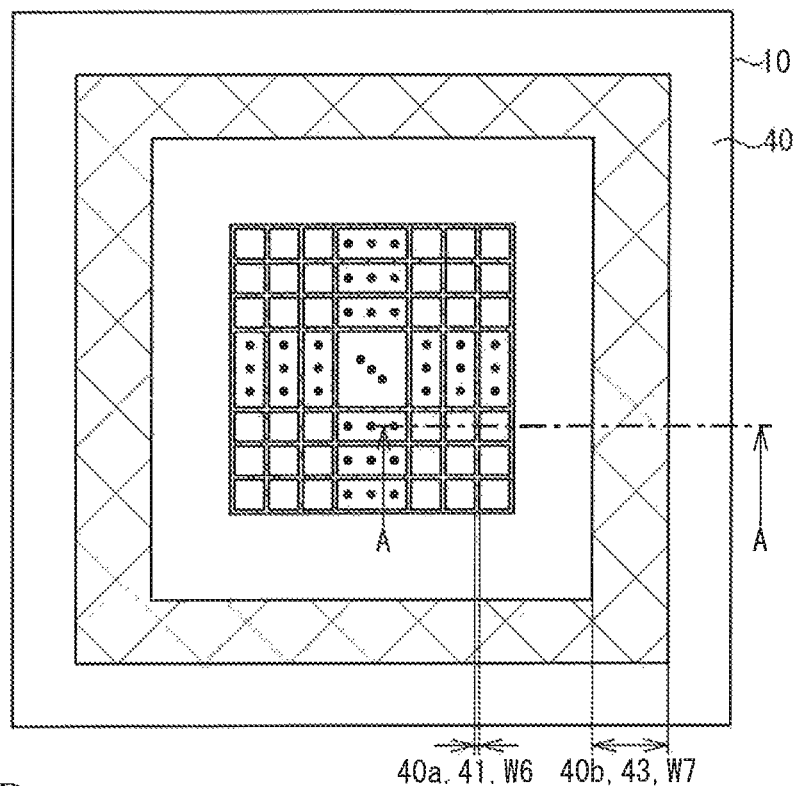
FIG. 3A is a plan view illustrating the example method of manufacturing the light receiving element.
Figure 3B:
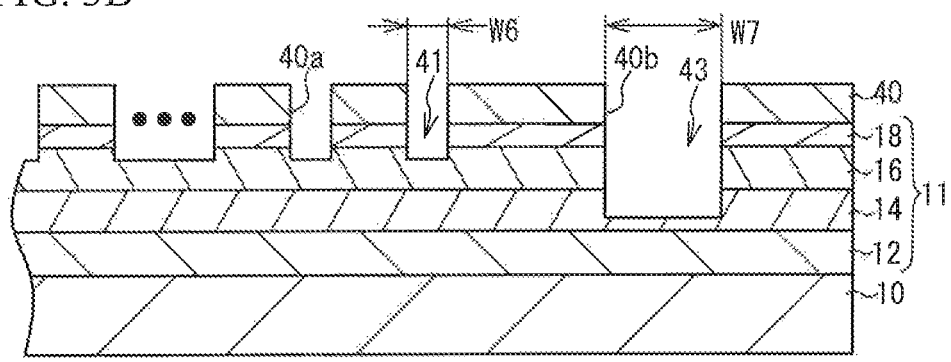
FIG. 3B is a cross-sectional view taken along the line A-A defined in FIG. 3A.

As shown in FIG. 2A, the n-type semiconductor layer 12, the light absorbing layer 14, the p-type semiconductor layer 16, and the p-type contact layer 18 are epitaxially grown in this order on the semiconductor substrate 10 in a wafer state. Prior to the growth of the n-type semiconductor layer 12, a buffer layer may be grown on the semiconductor substrate 10. In the growth, metal organic chemical vapor deposition (MOCVD), molecular beam epitaxy (MBE), or the like can be used. An insulator film mask layer 40 (the first mask) that is 0.5 to 2 μm in thickness, for example, and is formed with an insulator such as SiN or SiO2 is provided on the upper surface of the p-type contact layer 18. A photoresist is applied onto the insulator film mask layer 40, and resist patterning is performed, to form a resist mask 42 (the first resist mask). Openings 42a and 42b are formed in the resist mask 42, so that the insulator film mask layer 40 is exposed through the openings 42a and 42b.

Figure 2B:
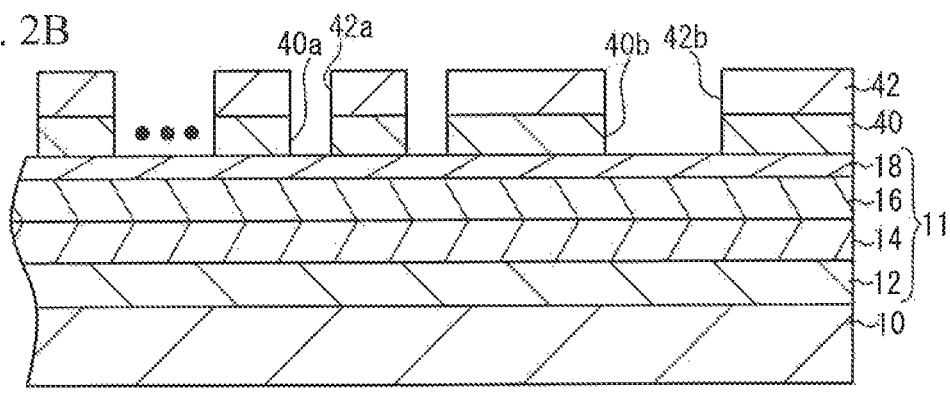

As shown in FIG. 2B, dry etching using a fluorine-based gas, for example, is performed, to shape the insulator film mask layer 40. The portions of the insulator film mask layer 40 exposed through the openings 42a and 42b of the resist mask are removed. Openings 40a (the first opening) are formed in the center of the insulator film mask layer 40, and an opening 40b (the second opening) that surrounds the central portion is formed on the outer side. The p-type contact layer 18 is exposed through the openings 40a and 40b.

As shown in FIG. 3A, the opening 40b is at a distance from each opening 40a. The openings 40a are in a lattice-like pattern, for example, and the opening 40b is a ring-like opening that surrounds the openings 40a. As shown in FIGS. 3A and 3B, after the resist mask 42 is removed, dry etching using a halogen-based gas is performed, for example. The hatched regions in FIG. 3A indicate the portions to be subjected to the etching. As the etching is performed on the portions of the semiconductor layer 11 exposed through the openings 40a or the opening 40b, grooves 41 and 43 are formed. The width W6 of the openings 40a and the grooves 41 is equal to the pitch P1 shown in FIGS. 1A and 1B, and is 0.5 to 3 μm, for example. The width W7 of the opening 40b and the groove 43 is equal to the width W2 of the groove 17 shown in FIGS. 1A and 1B, and is 20 to 290 μm, for example. At this stage, the etching rate is higher in the opening 40b with a great width than in the openings 40a with a small width (a micro-loading effect). The etching time is determined in accordance with the widths of the openings, the material of the semiconductor layer 11, a desired etching depth, and the like.

Figure 4A:
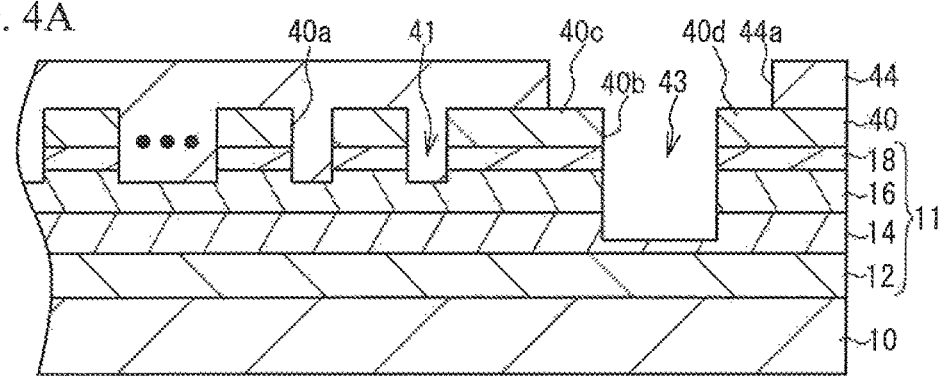
FIGS. 4A to 4C are cross-sectional views illustrating the example method of manufacturing the light receiving element.
Figure 5A:
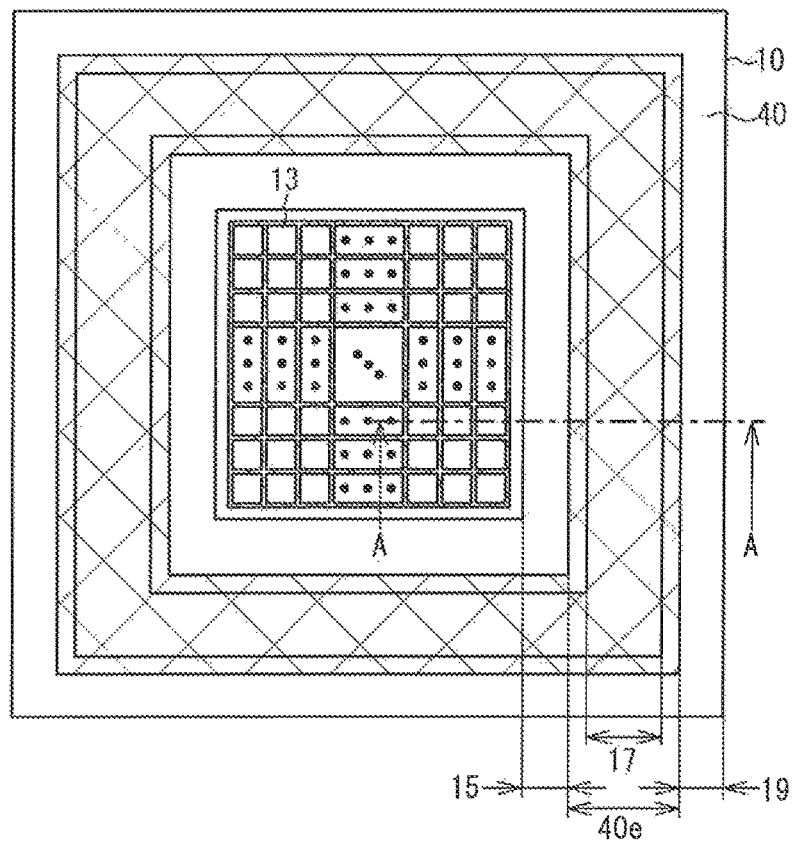
FIG. 5A is a plan view illustrating the example method of manufacturing the light receiving element.
Figure 5B:
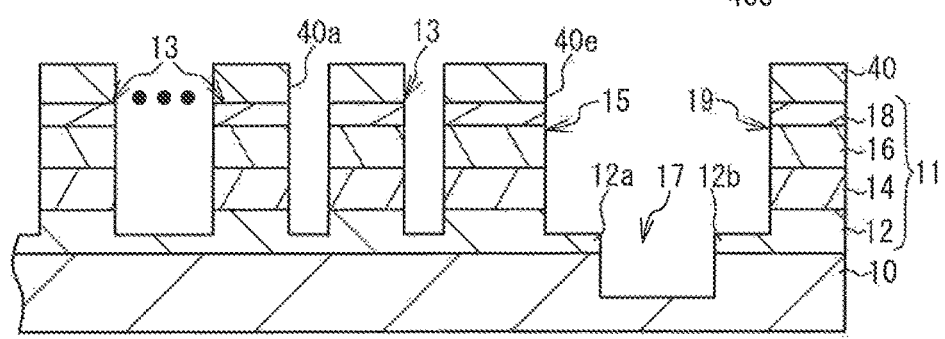
FIG. 5B is a cross-sectional view taken along the line A-A defined in FIG. 5A.

As shown in FIG. 4A, a photoresist is applied onto the insulator film mask layer 40, and resist patterning is performed, to form a resist mask 44 (the second resist mask). The resist mask 44 covers the grooves 41 of the semiconductor layer 11, and has an opening 44a. The opening 44a of the resist mask 44 is larger than the groove 43 of the semiconductor layer 11 and the opening 40b of the insulator film mask layer 40, and the groove 43 and the opening 40b are located inside the opening 44a. Of the insulator film mask layer 40, the regions 40c and 40d adjacent to the opening 40a are exposed through the opening 44a. The region 40c is located between the groove 43 and a groove 41, and the region 40d is located on the outer side of the groove 43. The width of the region 40c is 10 to 50 μm, for example, and the width of the region 40d is 0 to 50 μm, for example. That is, the region 40d is not necessarily formed.

Figure 4B:
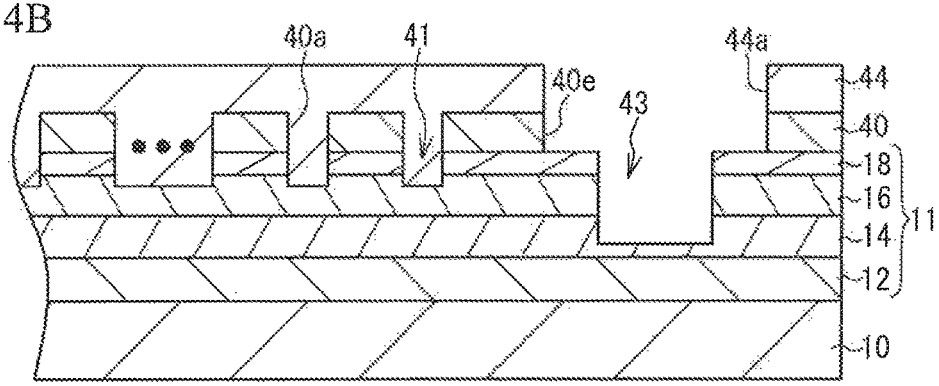
Figure 4C:
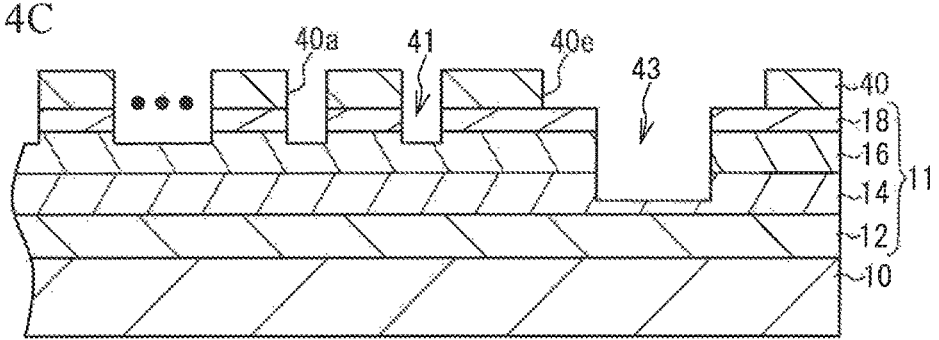

As shown in FIG. 4B, with the resist mask 44 serving as a mask, the regions 40c and 40d of the insulator film mask layer 40 are removed by wet etching with hydrofluoric acid, for example. As a result, an opening 40e (the fourth opening) that is larger than the opening 40b is formed in a position overlapping the opening 40b in the insulator film mask layer 40 (the second mask). The openings 40a remain (the third opening). As shown in FIG. 4C, the resist mask 44 is removed, and the insulator film mask layer 40 remains.

As shown in FIGS. 5A and 5B, dry etching using the insulator film mask layer 40 and a halogen-based gas, for example, is performed on the semiconductor layer 11. The hatched regions in FIG. 5A indicate the portions to be subjected to the etching. The etching time is determined in accordance with the widths of the openings, the material of the semiconductor layer 11, a desired etching depth, and the like. Because of a micro-loading effect, the etching rate is higher in the opening 40e than in the openings 40a of the insulator film mask layer 40. In the openings 40a, the grooves 41 shown in FIG. 3B are further subjected to the etching, so that grooves extending to the n-type semiconductor layer 12 are formed. In the opening 40e, the groove 43 is further subjected to the etching, so that the groove 17 extending to the semiconductor substrate 10 is formed. In the semiconductor layer 11, the mesas 13 are formed in the regions surrounded by the lattice-like openings 40a, and the terrace 15 is formed in the region interposed between the openings 40a and the opening 40e. That is, as shown in FIG. 5A, the mesas 13 arranged in a two-dimensional array are formed, and the ring-like groove 17 and the terrace 15 are formed on the outer side of the mesas 13. Etching is performed on the portions of the semiconductor layer 11 located on both sides of the groove 17 until the n-type semiconductor layer 12 is exposed, so that the n-type contact regions 12a and 12b are formed. The terrace 19 is formed on the outer side of the opening 40e.

Figure 6A:
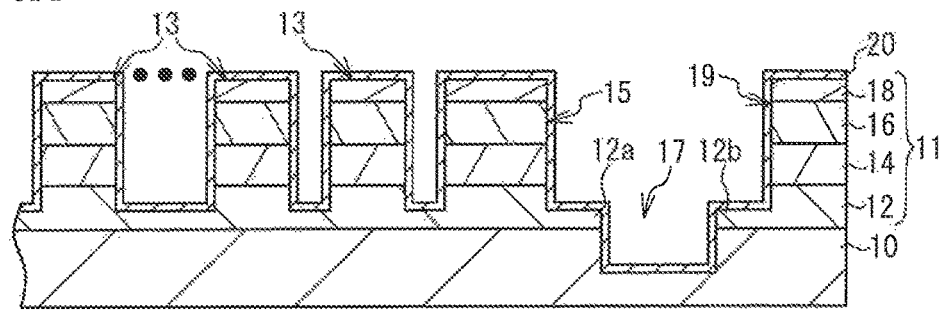
FIGS. 6A to 6C are cross-sectional views illustrating the example method of manufacturing the light receiving element.
Figure 6B:
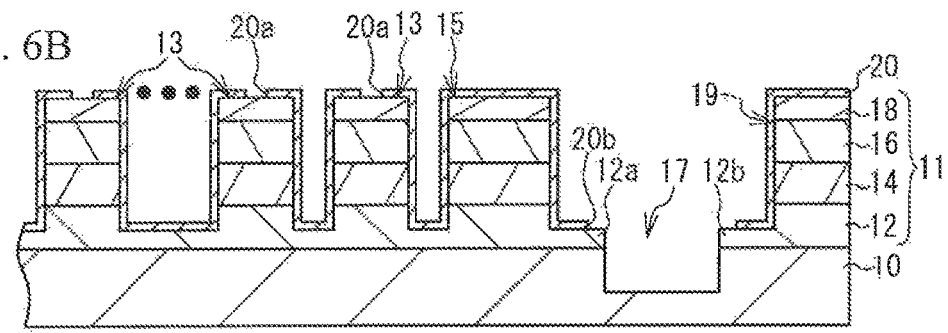

As shown in FIG. 6A, after the insulator film mask layer 40 is removed, the insulating film 20 is formed by chemical vapor deposition (CVD), for example. The insulating film 20 covers the surfaces of the mesas 13 and the terraces 15 and 19, and the bottom surface of the groove 17. As shown in FIG. 6B, etching is performed on the insulating film 20 by dry etching using a fluorine-based gas or wet etching using buffered hydrofluoric acid, for example, so that the openings 20a and 20b are formed. The groove 17 and the n-type contact regions 12a and 12b are located inside the opening 20b.

Figure 6C:
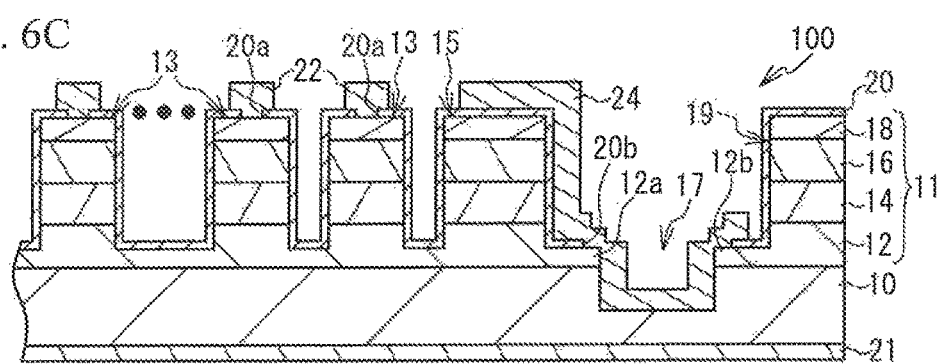

As shown in FIG. 6C, by a vapor deposition technique and a liftoff technique, for example, the electrodes 22 and 24 are formed. The electrodes 22 are in contact with the p-type contact layer 18 exposed through the openings 20a. The electrode 24 is formed on a portion extending from the top of the terrace 15 to an upper portion of the n-type contact region 12b via the surface of the n-type contact region 12a and the inside of the groove 17. The electrode 24 is in contact with the n-type semiconductor layer 12 in the n-type contact regions 12a and 12b, and is in contact with the semiconductor substrate 10 in the groove 17. The antireflection film 21 is formed on the lower surface of the semiconductor substrate 10, and dicing is performed on the wafer, to form the light receiving element 100. A bump may be provided on the electrodes 22 and 24.

Comparative Example 1

Figure 7A:
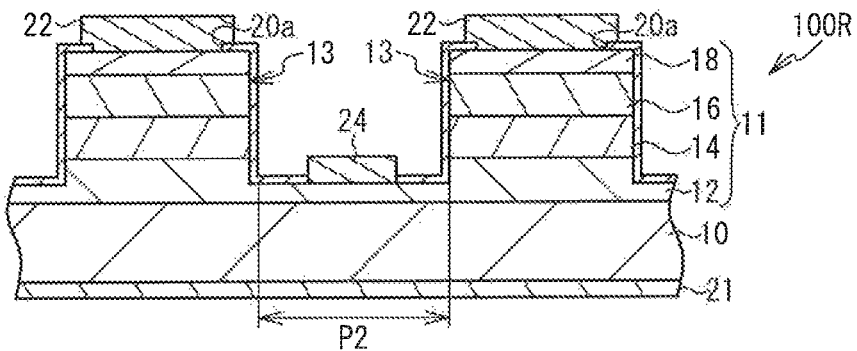
FIG. 7A is a cross-sectional view of an example of a light receiving element according to Comparative Example 1.

FIG. 7A is a cross-sectional view of an example of a light receiving element 100R according to Comparative Example 1. Explanation of the same components as those of the first embodiment will not be made below. The pitch P2 between the mesas 13 shown in FIG. 7A is greater than the pitch P1 shown in FIG. 1B. Accordingly, electrodes 24 can be provided between the mesas 13. However, since the pitch P2 is great, the number of mesas 13 that can be formed in the light receiving element 100R is smaller than that in the light receiving element 100, and the number of pixels in a case where the light receiving element 100R is used as an infrared sensor, for example, is also smaller. To increase the number of pixels, a larger number of mesas 13 should be formed. However, a larger number of mesas 13 will result in an increase in the size of the light receiving element 100R.

Comparative Example 2

Figure 7B:
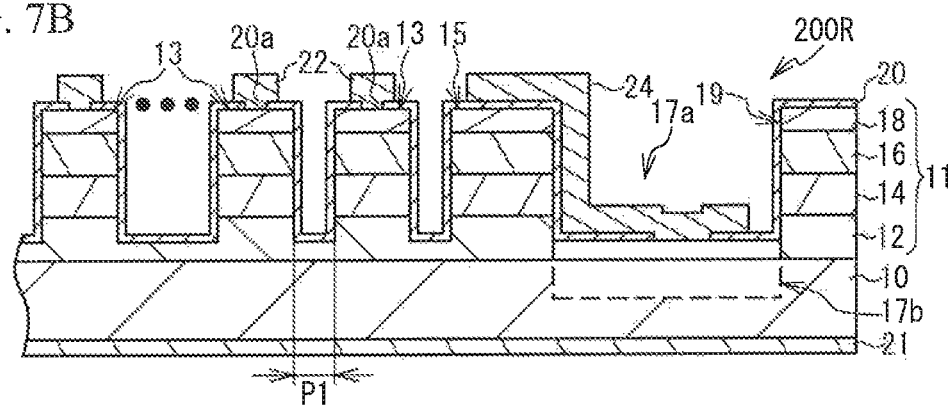
FIG. 7B is a cross-sectional view of an example of a light receiving element according to Comparative Example 2.

FIG. 7B is a cross-sectional view of an example of a light receiving element 200R according to Comparative Example 2. Explanation of the same components as those of the first embodiment will not be made below. The pitch between the mesas 13 is P1, which is smaller than the pitch P2 of Comparative Example 1. Accordingly, a larger number of mesas 13 can be formed. However, it is difficult to form electrodes 24 between the mesas 13. Therefore, an electrode 24 should be formed in a groove 17a located on the semiconductor substrate 10 on the outer side of the mesas 13.

In Comparative Example 2, the mesas 13, the terraces 15 and 19, and the groove 17a are formed by a one-time etching operation. That is, the groove 17a is formed at the same time as the grooves between the mesas 13. However, because of a micro-loading effect, the etching rate is higher in the region between the terraces 15 and 19 with a great width than in the regions between the mesas 13 with a small width. Therefore, the etching does not stop in the n-type semiconductor layer 12. As a result, a groove 17b extending to the semiconductor substrate 10 will be formed as indicated by a dashed line in FIG. 7B. In this case, it is difficult to electrically connect then-type semiconductor layer 12 and the electrode 24. The n-type semiconductor layer 12 is made thicker, so that the groove 17a having the n-type semiconductor layer 12 as its bottom surface can be formed. However, crystal defects might appear in the n-type semiconductor layer 12, and dark current might increase.

Comparative Example 3

Figure 7C:
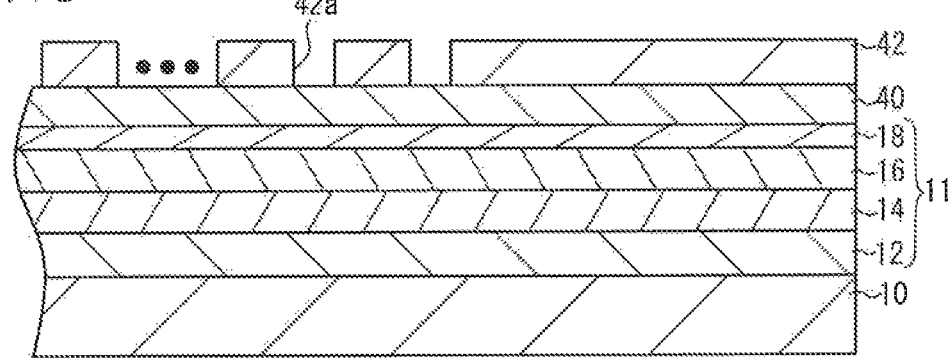
FIG. 7C is a cross-sectional view of an example of a light receiving element according to Comparative Example 3.

FIG. 7C is a cross-sectional view illustrating an example of a method of manufacturing a light receiving element according to Comparative Example 3. As shown in FIG. 7C, a resist mask 42 is used to shape an insulator film mask layer 40. The resist mask 42 in Comparative Example 3 has openings 42a, but does not have any opening 42b. The insulator film mask layer 40 is shaped by etching using the resist mask 42, and mesas 13 are formed by etching using the insulator film mask layer 40. After that, terraces and grooves are formed by etching using a mask that covers the mesas 13. However, the area of the resist mask 42 is large, and therefore, an altered layer might be generated from the resist mask 42 at the time of etching. Due to the altered layer, the etching is hindered, and it also becomes difficult to remove the resist mask after the etching.

According to this embodiment, on the other hand, etching is performed on the semiconductor layer 11 with the use of the insulator film mask layer 40 having the openings 40a and 40b as shown in FIGS. 3A and 3B, and etching is performed on the semiconductor layer 11 with the use of a mask having the openings 40a and 40e as shown in FIGS. 5A and 5B. The openings 40a are at distances from the openings 40b and 40e. Further, the widths of the openings 40b and 40e are greater than the width of the openings 40a. Accordingly, the etching rate is higher in the openings 40b and 40e than in the openings 40a. As a result, the mesas 13 and the terraces 15 and 19 are formed, and the groove 17 and the n-type contact regions 12a and 12b are formed in the opening 40e. As shown in FIG. 6C, the electrode 24 is formed on the n-type contact regions 12a and 12b, and is in contact with the n-type semiconductor layer 12.

That is, etching is performed twice, so that the n-type contact regions 12a and 12b are formed on the outer side of the mesas 13 in the light receiving element 100, and the electrode 24 and the n-type semiconductor layer 12 can be electrically connected in the n-type contact regions 12a and 12b. As the electrode 24 is located near the light absorbing layer 14, dark current can be reduced. Since there is no need to provide any electrode between the mesas 13, the pitch P1 between the mesas 13 can be made smaller as shown in FIGS. 1A and 1B. As a large number of mesas 13 are formed, the light receiving element 100 can have high-density pixels.

Of the semiconductor layer 11, the regions that are covered with the insulator film mask layer 40 at the time of the first etching and are exposed through the opening 40e at the time of the second etching turn into the n-type contact regions 12a and 12b after the second etching. As the n-type contact regions 12a and 12b can be formed by adjusting the etching range in the above manner, the manufacturing process can be simplified.

As shown in FIGS. 4A and 4B, the portions adjacent to the opening 40b of the insulator film mask layer 40 are removed, so that the opening 40e is formed. In other words, the opening 40b is made larger to form the opening 40e. In this manner, the manufacturing process is simplified. For example, the insulator film mask layer 40 may be removed after the first etching, and another mask having a wide opening including the groove 43 may be provided. The second etching may be performed with the use of the mask.

The resist mask 42 for shaping the insulator film mask layer 40 has the opening 42b as shown in FIG. 2A, and the resist mask 44 has the opening 44a as shown in FIG. 4A. With the use of these resist masks 42 and 44, etching is performed on the insulator film mask layer 40, so that the openings 40a, 40b, and 40e are formed in the insulator film mask layer 40. Accordingly, the manufacturing process is simplified. Further, the resist masks 42 and 44 have the wide openings 42b and 44a. Accordingly, the areas of the resist masks 42 and 44 are smaller than those in Comparative Example 3, and generation of an altered layer is prevented. Thus, etching is not easily hindered by an altered layer, and the resist masks 42 and 44 are effectively removed.

As shown in FIG. 1B, the n-type contact region 12a is located between the terrace 15 and the groove 17. With this arrangement, the distance between the electrode 24 and the light absorbing layer 14 can be shortened. That is, the volume of the n-type semiconductor layer 12 interposed between the light absorbing layer 14 and the electrode 24 becomes smaller. Thus, it is possible to reduce dark current generated due to lattice defects, impurities, or the like in the n-type semiconductor layer 12, for example.

As shown in FIGS. 3A and 5A, the openings 40a of the insulator film mask layer 40 are in a lattice-like pattern. As shown in FIG. 5B, the mesas 13 are formed by etching in the portions surrounded by the openings 40a. The mesas 13 are arranged in a two-dimensional array. The width W6 of the openings 40a is made smaller, so that the pitch P1 between the mesas 13 can be made smaller. As a large number of mesas 13 are formed, the light receiving element 100 can have high-density pixels. The openings 40a are not necessarily in a lattice-like pattern, but may be formed with grooves, for example. In that case, the mesas are formed in the regions interposed between the openings 40a in the semiconductor layer 11.

The width W7 of the opening 40b shown in FIGS. 3A and 3B is ten or more times greater than the width W6 of the openings 40a, for example. The width of the opening 40e shown in FIGS. 5A and 5B is ten or more times greater than the width of the openings 40a, for example. With this arrangement, etching accompanied by a micro-loading effect is performed. That is, the etching rate is higher in the openings 40b and 40e than in the openings 40a. As a result, the groove 17 and the n-type contact regions 12a and 12b can be formed.

The insulating film 20 covers the respective upper surfaces and the respective side surfaces of the mesas 13 and the terrace 15, so that the semiconductor layer 11 can be protected from foreign matter, moisture, and the like. Further, the insulating film 20 is interposed between each of the light absorbing layer 14, the p-type semiconductor layer 16, and the p-type contact layer 18, and the electrode 24, so that these layers are insulated. Since the etching is performed from above, it is difficult to remove only part of the insulating film 20 covering the side surfaces of the terraces 15 and 19, and expose the side surfaces of the n-type semiconductor layer 12. Therefore, it is preferable to provide the flat n-type contact regions 12a and 12b, remove the portions of the insulating film 20 located on the n-type contact regions 12a and 12b, and form the opening 20b, as shown in FIG. 6B. In the openings 20a of the insulating film 20, the electrodes 22 are in contact with the p-type contact layer 18. In the opening 20b, the electrode 24 is in contact with the n-type semiconductor layer 12. With this arrangement, the electrodes function as p-type electrodes, and the electrode 24 functions as an n-type electrode.

The electrode 24 is provided on a portion extending from the top of the terrace 15 to the n-type contact region 12b via the n-type contact region 12a and the groove 17, and covers the surfaces of these components. As a result, the joint strength of the electrode 24 increases, and detachment, disconnection, and the like are prevented. As the electrode 24 is in contact with the upper surfaces and the side surfaces of the n-type contact regions 12a and 12b, contact resistance becomes lower. It should be noted that the electrode 24 and the n-type semiconductor layer 12 can be connected in the n-type contact region 12a, and therefore, the n-type contact region 12b is not necessarily provided.

The n-type semiconductor layer 12, the light absorbing layer 14, and the p-type semiconductor layer 16 have superlattice structures including different semiconductor layers from one another. For example, the n-type semiconductor layer 12 is an n-type superlattice layer of GaSb/InAs, and the p-type semiconductor layer 16 is a p-type superlattice layer of GaSb/InAs. Because of lattice defects, impurities, and the like in these layers, there is a possibility of generation of dark current. The electrodes 22 are provided on the mesas 13, and the electrode 24 is provided on the n-type contact regions 12a and 12b, so that the distance between each of the electrodes 22 and 24, and the light absorbing layer 14 becomes shorter. As a result, dark current can be reduced or prevented. The materials of the respective layers may be changed. For example, the light absorbing layer 14 may be a GaSb/InAsSb superlattice layer. Further, the semiconductor layer 11 having a superlattice structure is matched to the semiconductor substrate 10. The semiconductor substrate 10 may be formed with some other compound semiconductor.

The n-type semiconductor layer 12 and the p-type semiconductor layer 16 should have different conductivity types from each other, one of the semiconductor layers being of the n-type, the other being of the p-type. The n-type semiconductor layer 12, the light absorbing layer 14, and the p-type semiconductor layer 16 may be formed with some other semiconductor, such as a compound semiconductor having a structure other than a GaSb/InAs superlattice structure. The light absorbing layer 14 absorbs light at different wavelengths outside the infrared band, and the n-type semiconductor layer 12 and the p-type semiconductor layer 16 may have a high transmittance (90% or higher, for example) for light having such wavelengths. Although the semiconductor substrate 10 is formed with GaSb in the above embodiment, the semiconductor substrate 10 may be formed with some other compound semiconductor.

What is claimed is:

1. A method of manufacturing a light receiving element, the method comprising:

a step of growing a semiconductor layer on a semiconductor substrate formed with a compound semiconductor, the semiconductor layer including a first layer of a first conductivity type, a light absorbing layer, a second layer of a second conductivity type, and a third layer of the second conductivity type that are sequentially stacked;

a step of forming a first mask on the semiconductor layer, the first mask having a first opening and a second opening, the second opening being at a distance from the first opening and having a greater width than the first opening;

a first step of performing etching on the semiconductor layer by using the first mask, to allow the etching to progress at a higher rate in the second opening than in a portion in the first opening in the semiconductor layer;

a step of forming a second mask on the semiconductor layer, the second mask having a third opening overlapping the second opening and having a greater width than the second opening;

a second step of performing etching on the semiconductor layer by using the second mask and the first mask, such that a portion of the first layer is exposed through the third opening of the second mask to become an n-type contact region after the second step of performing etching;

a third step of performing etching on the semiconductor layer by using the first mask, to form a mesa in a region interposed by the first opening in the semiconductor layer; and a step of forming a first electrode on the mesa and a second electrode on the n-type contact region, the first electrode being electrically connected to the third layer, the second electrode being electrically connected to the first layer, wherein the mesa includes the first layer, the light absorbing layer, the second layer, the third layer, and the n-type contact region.

2. The method according to claim 1, wherein, in the step of forming the second mask, a portion adjacent to the second opening is removed from the first mask.

3. The method according to claim 1, wherein the step of forming the first mask includes the step of forming the first opening and the second opening in the first mask by performing etching using a first photoresist, and the step of forming the second mask includes the step of forming the third opening by performing etching using a second photoresist and removing a portion adjacent to the second opening of the first mask.

4. The method according to claim 1, wherein, the second step of performing etching is performed on a region overlapping the first opening in the semiconductor layer until reaching the first layer, a terrace including the first layer, the light absorbing layer, the second layer, and the third layer is formed in a region interposed between the first opening and the third opening in the semiconductor layer, and a groove extending to the semiconductor substrate is formed in a position overlapping the second opening and the third opening.

5. The method according to claim 4, wherein the n-type contact region is located between the terrace and the groove.

6. The method according to claim 1, wherein the first mask has the first openings in a lattice-like pattern, in the step of performing etching, a plurality of mesas are formed in a region surrounded by the first opening in the semiconductor layer.

7. The method of according to claim 1, wherein a width of the second opening is at least ten times greater than a width of the first opening, and a width of the third opening is at least ten times greater than a width of the first opening.

8. The method according to claim 1, wherein
the first layer is an n-type superlattice layer, and
the second layer is a p-type superlattice layer.

9. The method according to claim 1, further comprising: the step of forming an insulating film covering respective upper surfaces and respective side surfaces of the mesa and the terrace; and the step of forming a fourth opening and a fifth opening in the insulating film, the fourth opening being located on the mesa, the fifth opening being located above the n-type contact region and the groove, wherein the first electrode is in contact with the third layer exposed through the fourth opening, and the second electrode is in contact with the first layer exposed through the fifth opening.

* * * * *